US012641894B2

(12) United States Patent
Shiozawa et al.

(10) Patent No.: US 12,641,894 B2
(45) Date of Patent: May 26, 2026

(54) PIXEL STRUCTURE WITH REFLECTIVE METAL LAYER IN A METAL LAYER TO IMPROVE THE PHOTOELECTRIC CONVERSION EFFICIENCY AND REDUCING STRAY LIGHT NOISES IN THE SUBSTRATE

(71) Applicant: PIXART IMAGING INC., Hsin-Chu County (TW)

(72) Inventors: Kazufumi Shiozawa, Hsin-Chu County (TW); Kazuya Yonemoto, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 714 days.

(21) Appl. No.: 18/157,842

(22) Filed: Jan. 23, 2023

(65) Prior Publication Data

US 2024/0250096 A1    Jul. 25, 2024

(51) Int. Cl.
*H01L 27/146* (2006.01)
*H10F 39/00* (2025.01)
(52) U.S. Cl.
CPC ......... *H10F 39/802* (2025.01); *H10F 39/805* (2025.01); *H10F 39/812* (2025.01)

(58) Field of Classification Search
CPC .... H10F 39/802; H10F 39/805; H10F 39/812; H10F 39/199; H10F 39/8057; H10F 39/8067; H10K 39/32; H10K 30/80; H10K 39/38
See application file for complete search history.

(56) References Cited

U.S. PATENT DOCUMENTS

2019/0244992 A1* 8/2019 Yokogawa .......... H10F 39/8023

FOREIGN PATENT DOCUMENTS

JP        2011238781 A    11/2011

* cited by examiner

*Primary Examiner* — Ermias T Woldegeorgis
(74) *Attorney, Agent, or Firm* — HAUPTMAN HAM, LLP

(57)        ABSTRACT

There is provided a pixel structure including a top electrode, multiple bottom electrodes, an optically sensitive material layer and a metal wire layer. The optically sensitive material layer is arranged between the top electrode and the multiple bottom electrodes. The bottom electrodes corresponding to different pixels are separated from one another and have a gap therebetween. The metal wire layer has a reflective metal layer arranged opposite to the gap. The reflective metal layer reflects residual stray light penetrating the optically sensitive material layer by the surface plasmon resonance effect.

20 Claims, 10 Drawing Sheets

100

1411

1412

1413

1411

1413

1412

1411

1412

1413

1411

1412

1413

1411

1412

1413

1411

1412

1413

400

PIXEL STRUCTURE WITH REFLECTIVE METAL LAYER IN A METAL LAYER TO IMPROVE THE PHOTOELECTRIC CONVERSION EFFICIENCY AND REDUCING STRAY LIGHT NOISES IN THE SUBSTRATE

BACKGROUND

1. Field of the Disclosure

This disclosure generally relates to an image sensor and, more particularly, to a pixel structure adopting optically sensitive material and having improved photoelectric conversion efficiency by the surface plasmon resonance effect thereby improving the image quality of the image sensor.

2. Description of the Related Art

The image sensor adopting organic photoconductor materials or quantum dot materials generally includes a top electrode, a photodiode (formed by the organic photoconductor materials or quantum dot materials), a bottom electrode, a metal wire layer and a substrate. The bottom electrode is arranged under the photodiode and is divided from one another at edges of pixels in order to separate different pixels. The gap between the divided bottom electrodes is to reduce the cross-talk between adjacent pixels. However, stray light can go through the gap between bottom electrodes and reach the substrate to induce additional charges on the substrate. These additional charges are considered as noises which can degrade the image quality of the image sensor.

To solve this issue, JP 2011-238781 provides a light blocking film placed within the gap between the bottom electrodes to stop stray light from penetrating the metal wire layer and reaching the substrate so as to reduce stray light interference. However, to add said additional light blocking film, the manufacturing cost is increased. Meanwhile, said additional light blocking film is used to absorb stray light, and thus the stray light cannot be reused such that the photoelectric conversion efficiency cannot be improved.

Accordingly, the present disclosure provides a pixel structure that is arranged with an additional reflective metal layer in a metal wire layer for blocking and reflecting stray light penetrating the gap between bottom electrodes to achieve the objectives of improving the photoelectric conversion efficiency and reducing stray light noises in the substrate. Meanwhile, because the reflective metal layer is manufactured together with the metal wire layer, the manufacturing steps and cost are not increased.

SUMMARY

The present disclosure provides a pixel structure in which a reflective metal layer in a metal wire layer includes at least one metal block (or region) arranged between bottom electrodes and a shielding electrode in a transverse direction to block and reflect stray light going through the gap between the bottom electrodes.

The present disclosure provides a pixel structure including a substrate, a first electrode, multiple second electrodes, an optically sensitive material (OSM) layer and a metal layer. The substrate is arranged at a backside of the pixel structure and with a pixel circuit. The first electrode is arranged at a front side of the pixel structure. The multiple second electrodes have a gap from one another, and each second electrode is corresponding to one pixel region. The OSM layer is sandwiched between the first electrode and the multiple second electrodes, and is configured to receive light to generate signal charges. The metal layer includes a shielding metal layer, a transfer metal layer and a reflective metal layer. The shielding metal layer surrounds each pixel region and configured to provide a voltage to the pixel circuit. The transfer metal layer is configured to transfer the signal charges. The reflective metal layer is arranged between the shielding metal layer and the transfer metal layer in a transverse direction, and is aligned with the gap in a longitudinal direction.

The present disclosure further provides a pixel structure including a substrate, a first electrode, multiple second electrodes, an optically sensitive material (OSM) layer and a metal layer. The substrate is arranged with a pixel circuit. The first electrode is arranged at a front side of the pixel structure. The multiple second electrodes have a gap from one another, and each second electrode is corresponding to one pixel region. The OSM layer is sandwiched between the first electrode and the multiple second electrodes, and is configured to receive light to generate signal charges. The metal layer is arranged to be closer to a backside of the pixel structure than the substrate, and includes a shielding metal layer, a transfer metal layer and a reflective metal layer. The shielding metal layer surrounds each pixel region and configured to provide a voltage to the pixel circuit. The transfer metal layer is configured to transfer the signal charges. The reflective metal layer is arranged between the shielding metal layer and the transfer metal layer in a transverse direction, and is aligned with the gap in a longitudinal direction.

The present disclosure further provides a pixel structure including a substrate, multiple optically sensitive material (OSM) layers and a metal layer. The substrate is arranged at a front side of the pixel structure and with a pixel circuit. The multiple OSM layers are arranged in the substrate, and respectively configured to receive light to generate signal charges. The metal layer is arranged to be closer to a backside of the pixel structure than the substrate, and includes a shielding metal layer, a transfer metal layer and a reflective metal layer. The shielding metal layer surrounds each pixel region and configured to provide a voltage to the pixel circuit. The transfer metal layer is configured to transfer the signal charges. The reflective metal layer is arranged between the shielding metal layer and the transfer metal layer in a transverse direction, and is aligned with the multiple OSM layers in a longitudinal direction.

In the present disclosure, the optically sensitive material (OSM) layer is, for example, an organic photoconductive film or a quantum dots film, but not limited thereto.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

The objective of the present disclosure is to provide a pixel structure of a pixel array capable of improving photoelectric conversion efficiency and reducing stray light noises in a substrate without increasing the manufacturing steps and cost.

Figure 1:
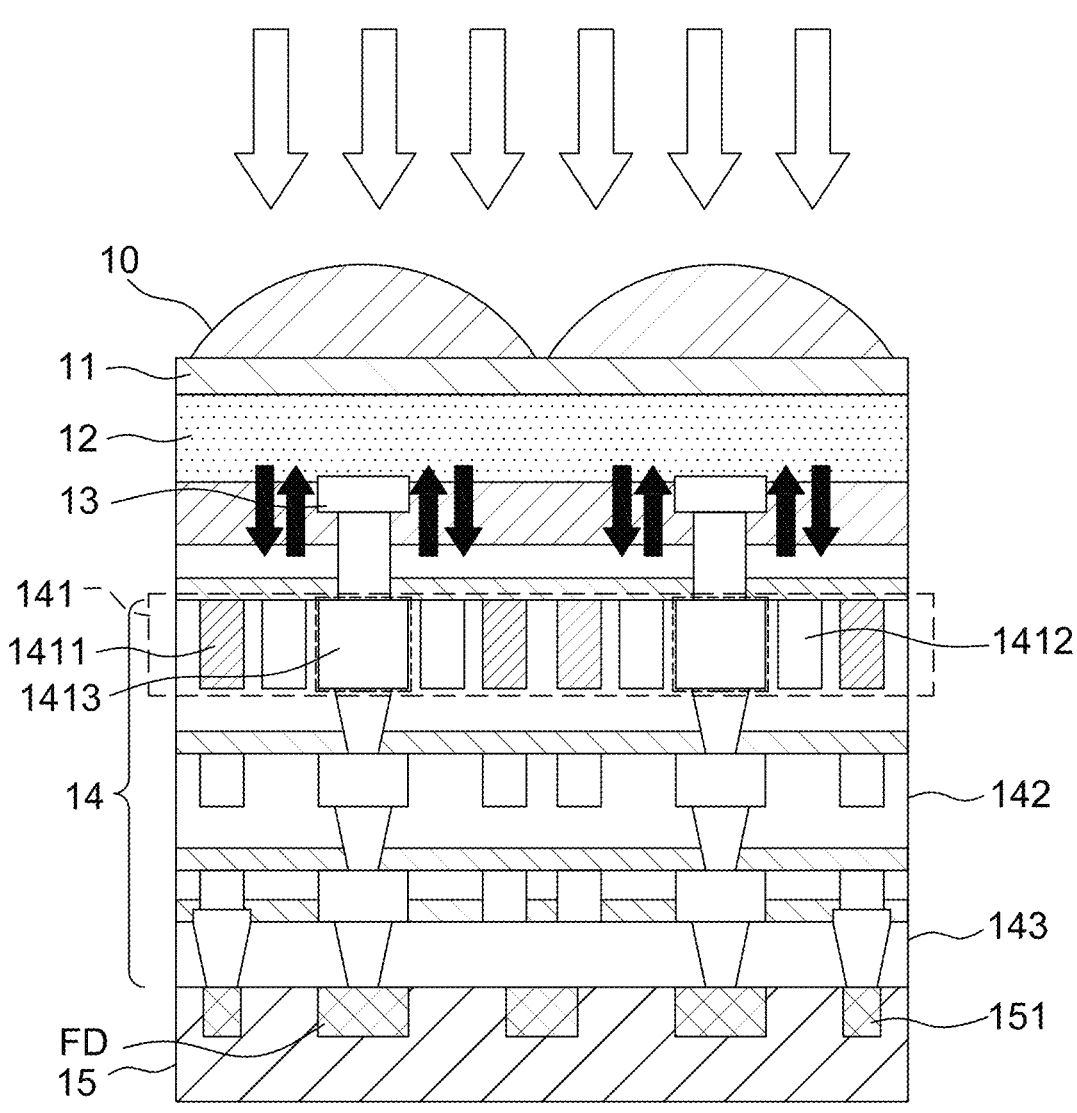
FIG. 1 is a cross sectional view of a pixel structure according to a first embodiment of the present disclosure.

Please refer to FIG. 1, it is a cross sectional view of a pixel structure 100 according to a first embodiment of the present disclosure. The pixel structure 100 includes an optically sensitive material (OSM) layer 12, a metal wire layer 14, a substrate (shown at a backside of the pixel structure 100) 15 and a pixel circuit 151 in the substrate 15. The pixel circuit 151 includes, for example, a reset transistor, amplifier transistor, a vertical scan transistor or other transistors according to different applications. One function of the metal wire layer 14 is to transmit electric signals between the OSM layer 12 and the substrate 15. The substrate 15 is, for example, a silicon substrate which can generate charges to cause noises while receiving/absorbing light.

As shown in FIG. 1, the OSM layer 12 is sandwiched between a first electrode 11 (e.g., shown as the top electrode) and multiple second electrodes (e.g., shown as the bottom electrode), wherein the first electrode 11 (e.g., shown at a front side of the pixel structure 100) is preferably made of transparent material to form a transparent electrode, e.g., including indium tin oxide (ITO) and indium zinc oxide (IZO), but not limited thereto. The second electrodes 13 are preferably made of TiN for compatibility with the OSM layer 12, and are respectively connected to a node FD (a part of the pixel circuit 151), which is used as a floating diffusion node of the pixel circuit 151. The OSM layer 12 is used to receive/absorb incident light (shown by hollow arrows) penetrating the first electrode 11 to generate signal charges, which are integrated into the node FD via the second electrode 13 and a transfer metal layer 1413 described below. In other words, a voltage on the node FD reflects detected light energy of the pixel structure 100. The operation of the pixel circuit 151 is known to the art and not a main objective of the present disclosure, and thus details thereof are not described herein.

In the present disclosure, the multiple second electrodes 13 have a gap from one another, and each second electrode 13 is corresponding to one pixel region, i.e. within one pixel region. It should be mentioned that FIG. 1 shows only two second electrodes 13 separated from each other in the left-right direction, although not shown the second electrodes 13 in the front-back direction (i.e. the direction perpendicular to the left-right direction and the up-down direction of FIG. 1) are also separated from each other. That is, the multiple second electrodes 13 are multiple separated electrodes in a transverse direction. By arranging multiple pixel regions, a pixel array is formed.

As shown in FIG. 1, each pixel region further includes multiple microlenses 10 located at the light incident side for increasing the light sensing efficiency. If the pixel structure 100 is adapted to a color image sensor, each pixel region further includes a color filter, which is known to the art and not a main objective of the present disclosure, and thus details thereof are not described herein.

The microlenses 10, the first electrode 11, the OSM layer 12, the multiple second electrodes 13, the metal wire layer 14 and the substrate 15 are stacked in a longitudinal direction (i.e. the up-down direction in FIG. 1).

The metal wire layer 14 of the pixel structure 100 is made of, for example, Cu or Al, and includes a shielding metal layer 1411 and a transfer metal layer 1413. The shielding metal layer 1411 is arranged at edges surrounding each pixel region, e.g., shown in FIG. 2A to FIG. 2G. The shielding metal layer 1411 is to provide a voltage to the pixel circuit 151, and forms an electric filed to prevent interference between adjacent pixels. The transfer metal layer 1413 is to transfer signal charges generated by the OSM layer 12 to the pixel circuit 151, e.g., shown to be transferred to the node FD, via the second electrodes 13.

In the present disclosure, one metal layer (e.g., called M1 metal layer 141 herein) among the metal wire layer 14 closest to the OSM layer 12 is further arranged with a reflective metal layer 1412. The reflective metal layer 1412 is arranged between the shielding metal layer 1411 and the transfer metal layer 1413 in a transverse direction (e.g., the up-down direction and the left-right direction in FIGS. 2A to 2G), and is aligned with the gap in a longitudinal direction (e.g., the up-down direction in FIG. 1). The reflective metal layer 1412 is used to reflect stray light (e.g., shown by solid arrows) penetrating the gap. Because the reflective metal layer 1412 is manufactured together with the M1 metal layer 141, the reflective metal layer 1412 has the same material as the M1 metal layer 141. Since the reflective metal layer 1412 can be formed in manufacturing the M1 metal layer 141 only by changing the mask, an additional manufacturing step is not required and the manufacturing cost is not increased.

In one aspect, the reflective metal layer 1412 includes multiple metal blocks (e.g., formed as island pattern) distributed between the shielding metal layer 1411 and the transfer metal layer 1413 as shown in FIGS. 2A to 2F.

Figure 2A:
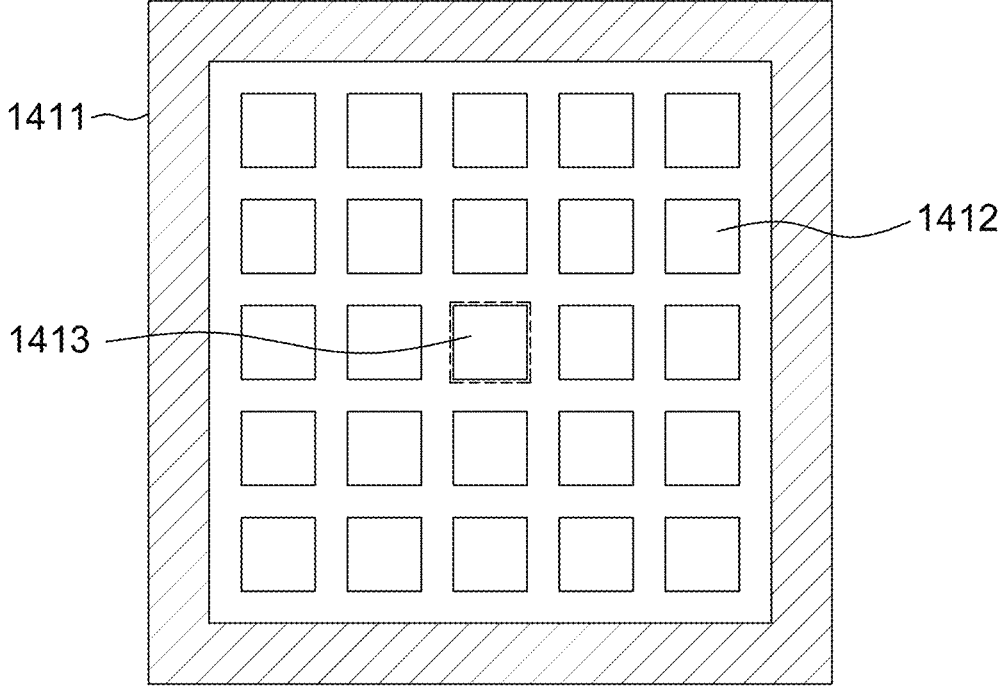
FIGS. 2A-2G are top views of a metal wire layer within one pixel region of the pixel structure according to some embodiments of the present disclosure.
Figure 2B:
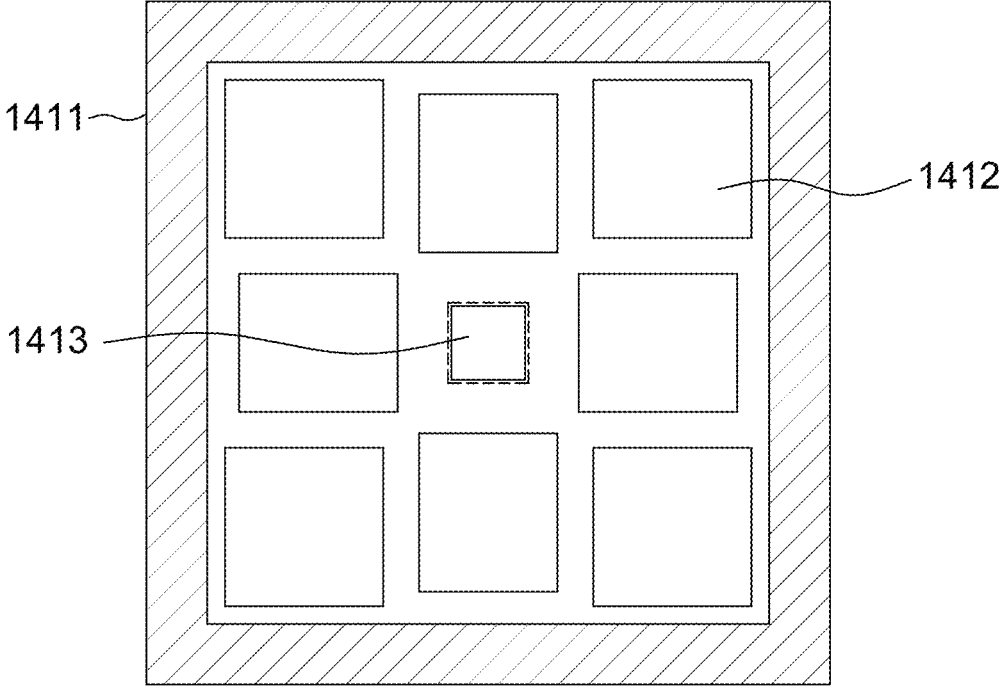
Figure 2C:
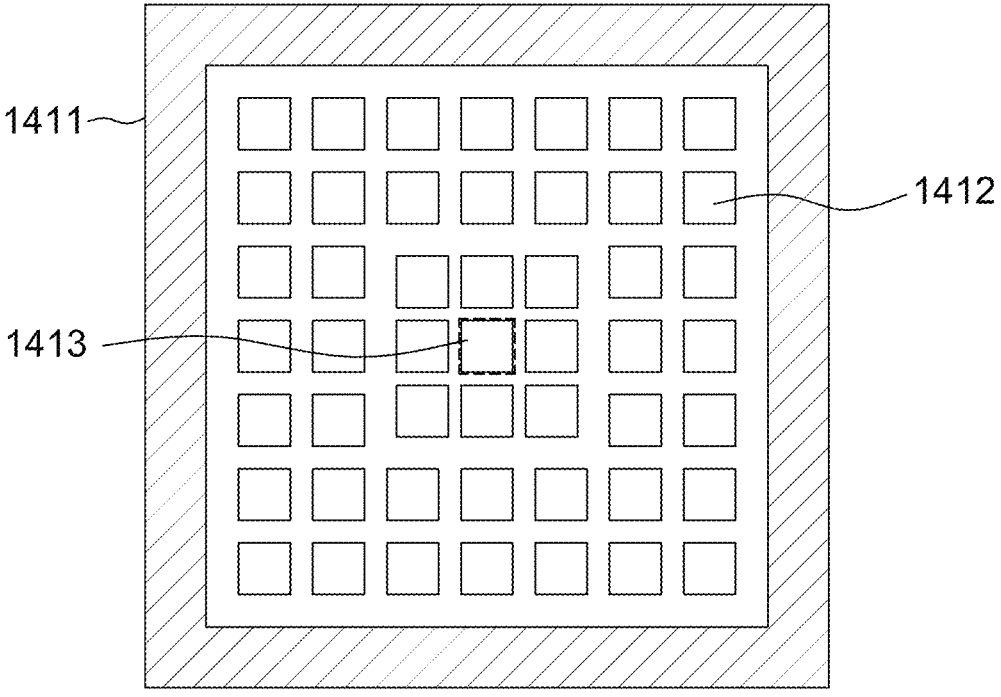
Figure 2D:
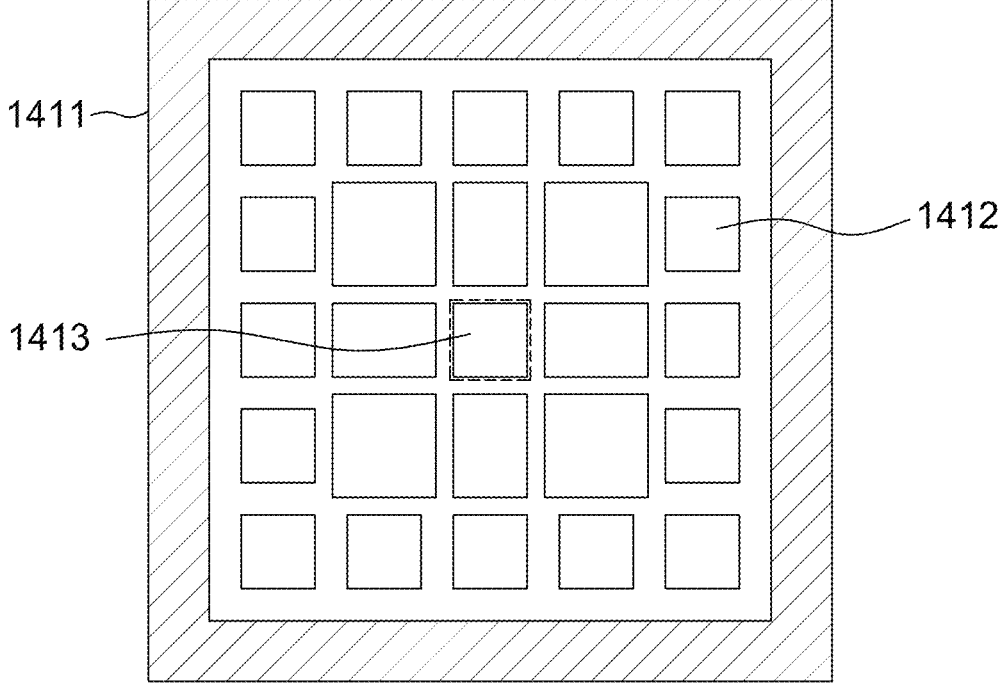

For example, all of the multiple metal blocks (or called metal regions) 1412 have the same cross-sectional area, as shown in FIGS. 2A and 2C. Preferably, a period of the metal blocks 1412 is optimized according to a wavelength of incident light, e.g., shorter than the wavelength. That is, the multiple metal blocks 1412 are periodically arranged in the transverse direction in the M1 metal layer 414.

For example, a part of the multiple metal blocks 1412 have different cross-sectional areas, as shown in FIG. 2B and FIGS. 2D to 2F.

To improve light reflectivity, a gap between the multiple metal blocks 1412 is preferably smaller than a width and length of each metal block 1412, as shown in FIGS. 2A to 2F, and is formed as narrow as the manufacturing process permits. Distances between the multiple metal blocks 1412 are all identical to or different from one another without particular limitations.

For example, all of the multiple metal blocks 1412 are separated from the shielding metal layer 1411 (e.g., as floating state), as shown in FIGS. 2A to 2D.

Figure 2E:
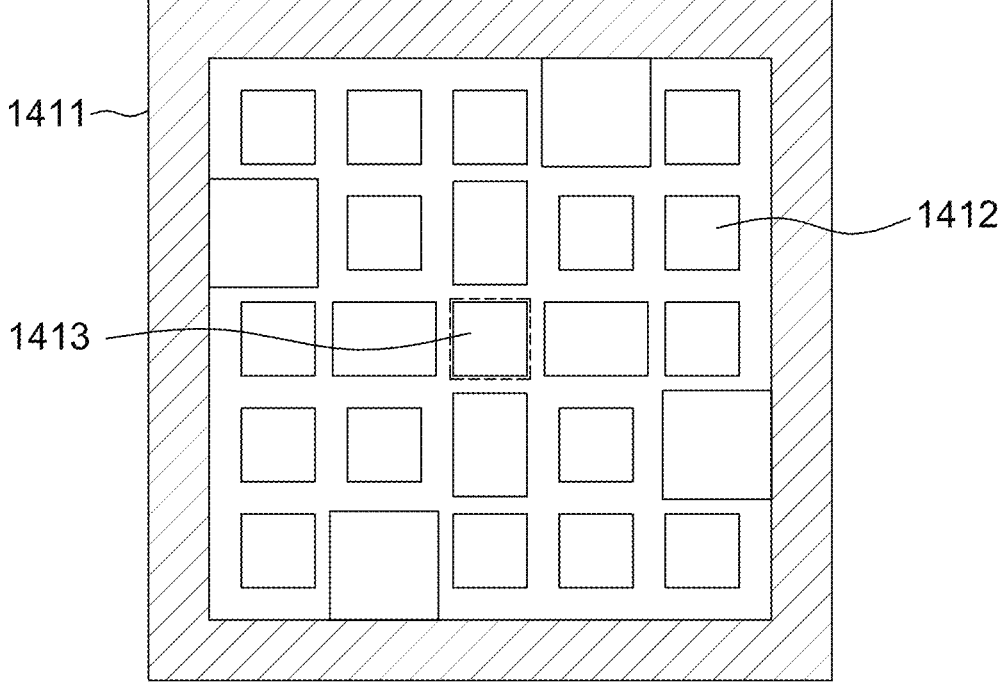
Figure 2F:
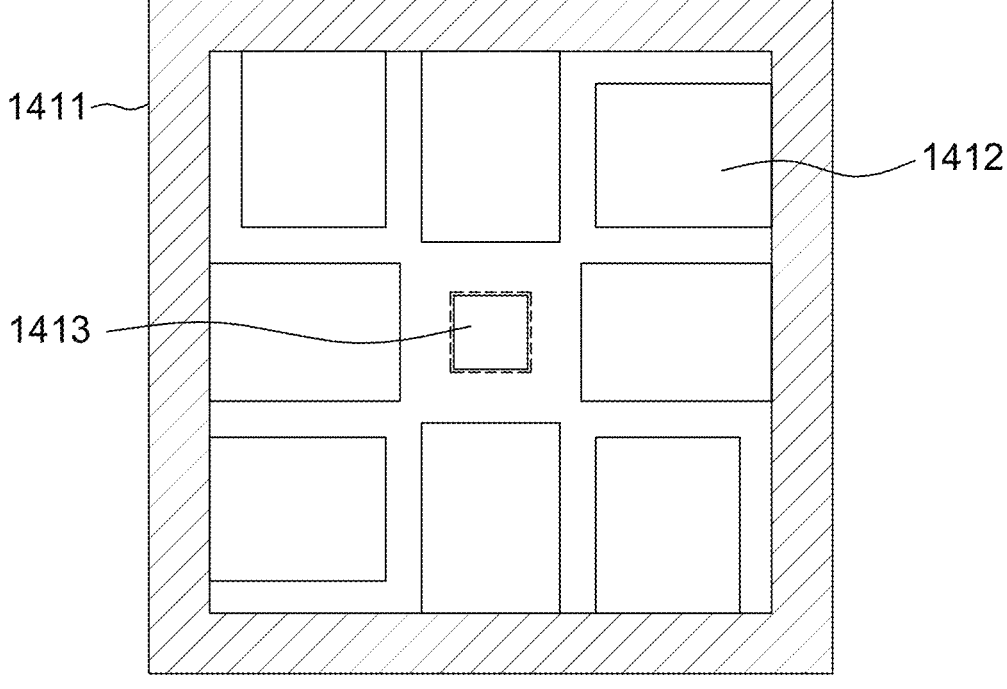

For example, at least a part of the multiple metal blocks 1412 are connected with the shielding metal layer 1411, as shown in FIGS. 2E to 2F.

For example, the multiple metal blocks 1412 are symmetrical in two perpendicular directions (i.e. the up-down direction and the left-right direction) in the transverse direction, as shown in FIGS. 2A to 2D.

For example, the multiple metal blocks 1412 are rotational symmetry in the transverse direction, as shown in FIGS. 2E to 2F.

Figure 2G:
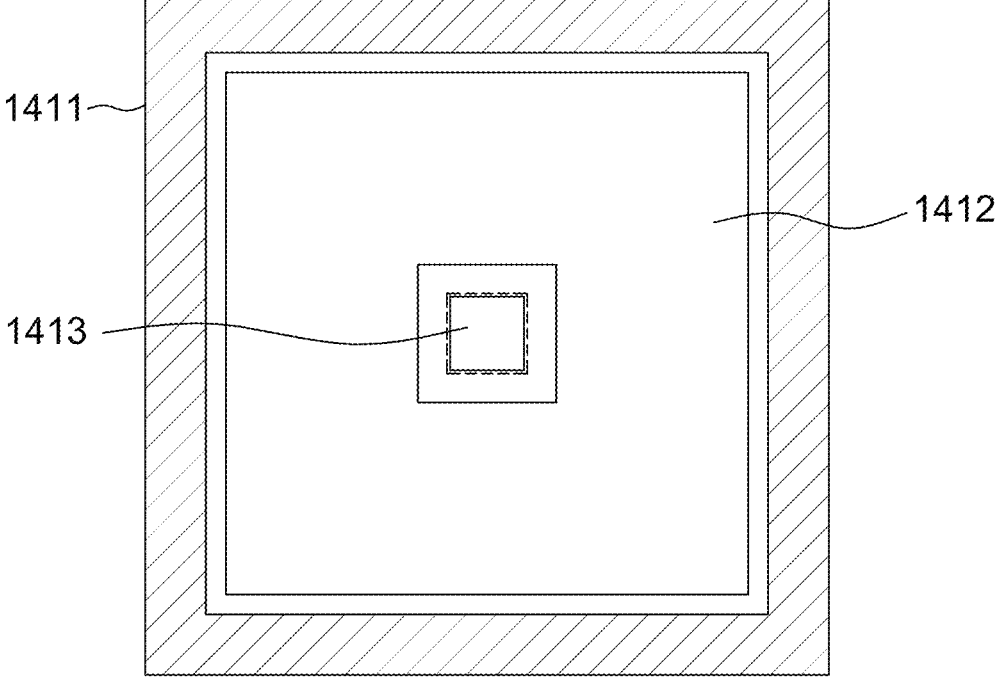

In another aspect, the reflective metal layer 1412 includes a single metal block extending between the shielding metal layer 1411 and the transfer metal layer 1413 in the transverse direction, and electrically separated from the shielding metal layer 1411 and the transfer metal layer 1413, e.g., a ring shape as shown in FIG. 2G. Distances between the reflective metal layer 1412 and the shielding metal layer 1411 as well as between the reflective metal layer 1412 and the transfer metal layer 1413 are preferably smaller than a wavelength of incident light, e.g., formed as narrow as the manufacturing process permits.

In another aspect, the reflective metal layer 1412 includes multiple metal rings between the shielding metal layer 1411 and the transfer metal layer 1413, and a distance between adjacent metal rings is preferably smaller than a wavelength of incident light, e.g., formed as narrow as the manufacturing process permits.

FIGS. 2A to 2G show one pixel region of a pixel array. The pixel array of an image sensor includes multiple pixel regions arranged in a matrix.

It should be mentioned that although FIGS. 2A to 2G show the transfer metal layer 1413 is located at the center of one pixel region in the M1 metal layer 141, it is only intended to illustrate but not to limit the present disclosure. In other aspects, the transfer metal layer 1413 is not located at the center of one pixel region in the M1 metal layer 141.

FIG. 1 shows that the metal wire layer 14 further includes an M2 metal layer 142 and an M3 metal layer 143 arranged closer to the back side. In one aspect, the M2 metal layer 142 and an M3 metal layer 143 respectively include shielding metal layers and transfer metal layers respectively corresponding to the shielding metal layer 1411 and the transfer metal layer 1413 in the M1 metal layer 141. In another aspect, the M2 metal layer 142 and an M3 metal layer 143 respectively include transfer metal layers corresponding to the transfer metal layer 1413 in the M1 metal layer 141 but have no shielding metal layers therein. A number of metal layers contained in the metal wire layer 14 is not particularly limited. The M1 metal layer 141 is the one closest to the OSM layer 12 among multiple metal layers of the metal wire layer 14. Metals in the metal wire layer 14 are insulated using, for example, oxide film, but not limited to.

Figure 3:
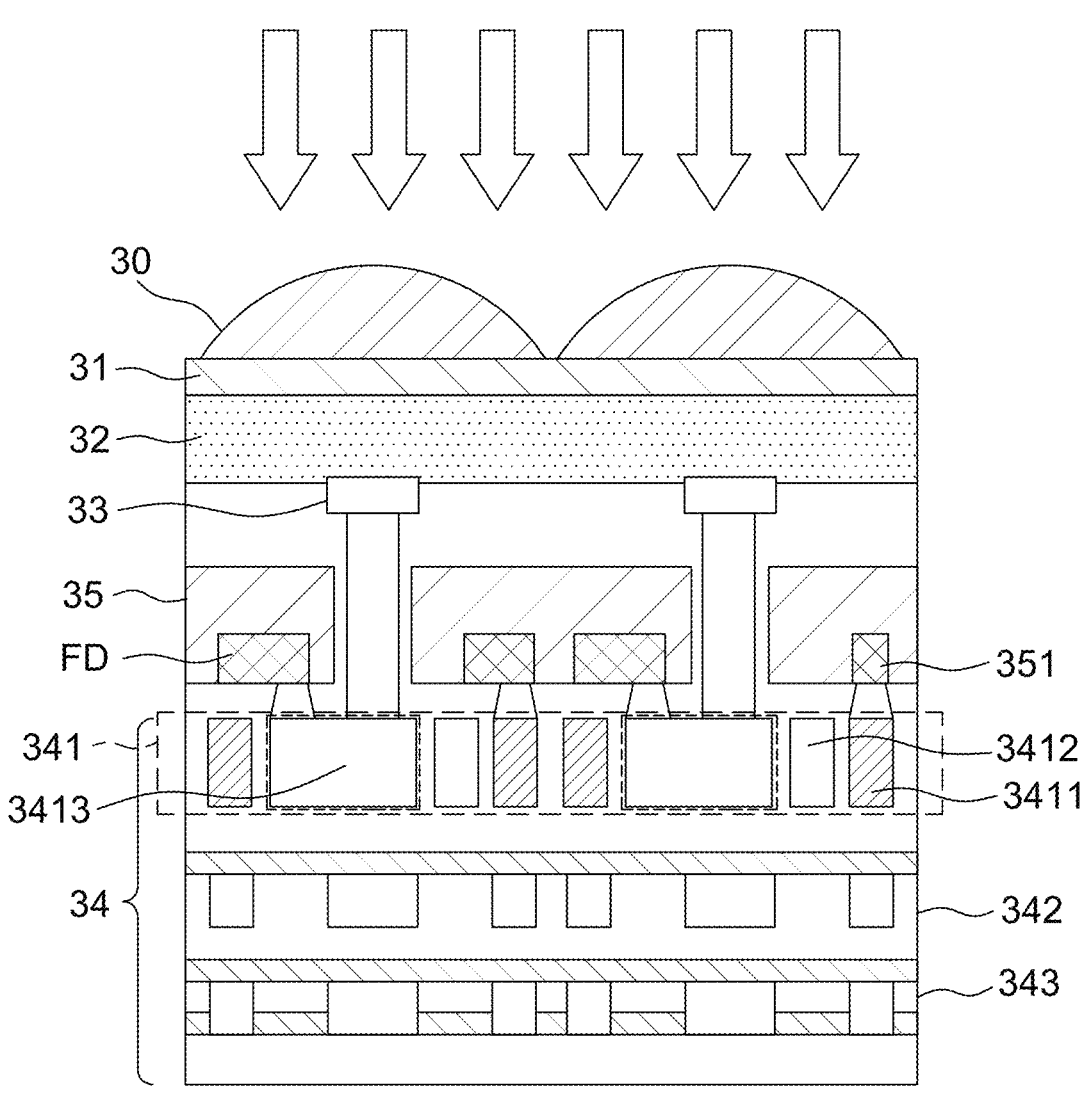
FIG. 3 is a cross sectional view of a pixel structure according to a second embodiment of the present disclosure.

Please refer to FIG. 3, it is a cross sectional view of a pixel structure 300 according to a second embodiment of the present disclosure. The pixel structure 300 includes multiple microlenses 30, a first electrode 31, an optically sensitive material (OSM) layer 32, multiple second electrodes 33, a substrate 35 and a metal wire layer 34 forming a stacked structure from a front side to a backside of the pixel structure 300. The microlenses 30, the first electrode 31, the OSM layer 32 and the multiple second electrodes 33 are respectively identical to the microlenses 10, the first electrode 11, the OSM layer 12 and the multiple second electrodes 13 of the first embodiment and thus details thereof are not repeated again. The substrate 35 is, for example, a silicon substrate, but not limited to.

The difference between the second embodiment and the above first embodiment is that the substrate 35 is arranged between the OSM layer 32 and the metal wire layer 34 in a stacking direction. The metal wire layer 34 also includes an M1 metal layer 341 as the one closest to the OSM layer 32. The metal wire layer 34 further includes an M2 metal layer 342 and an M3 metal layer 343 stacked along the backside.

The M1 metal layer 341 also includes a shielding metal layer 3411, a transfer metal layer 3413 and a reflective metal layer 3412.

The shielding metal layer 3411 is arranged at edges surrounding each pixel region and capable of providing a voltage to the pixel circuit 351. The function and the arrangement of the shielding metal layer 3411 are substantially identical to those of the shielding metal layer 1411 as mentioned above, and thus details thereof are not repeated again.

The transfer metal layer 3413 is used to transfer signal charges generated by the OSM layer 32 to a node FD. The function and the arrangement of the transfer metal layer 3413 are substantially identical to those of the shielding metal layer 1413 as mentioned above, and thus details thereof are not repeated again.

The reflective metal layer 3412 is arranged between the shielding metal layer 3411 and the transfer metal layer 3413 in the transverse direction (e.g., referring to FIGS. 2A to 2G), and is aligned with the gap between the second electrodes 33. The reflective metal layer 3412 is to reflect stray light going through the gap back to the OSM layer 32 to be reused such that the photoelectric conversion efficiency is improved. The function and the arrangement of the reflective metal layer 3412 are substantially identical to those of the reflective metal layer 1412 as mentioned above, and thus details thereof are not repeated again.

Figure 4:
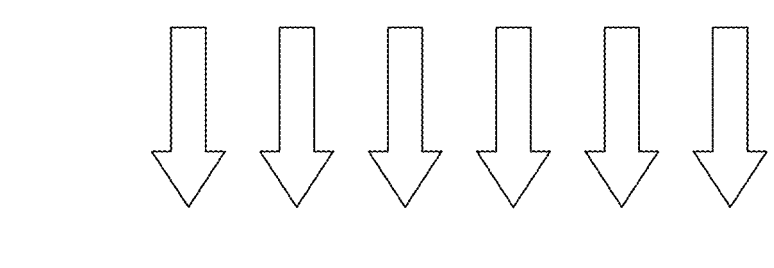
FIG. 4 is a cross sectional view of a pixel structure according to a third embodiment of the present disclosure.
Figure 4:
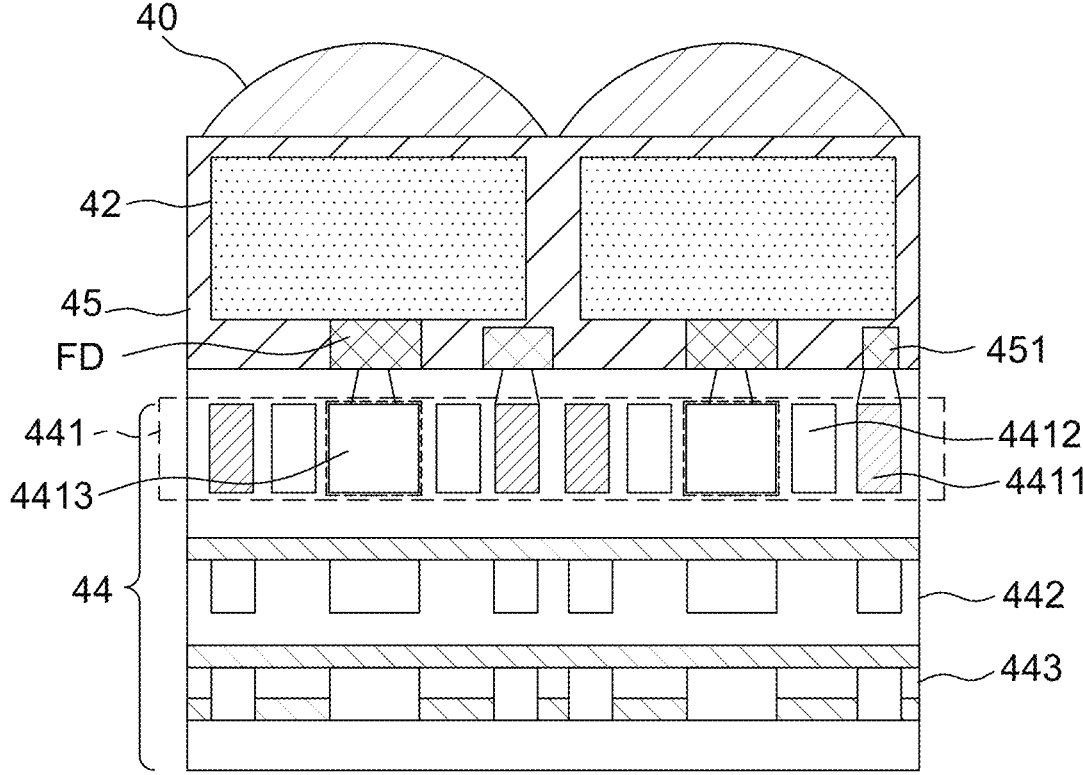

Please refer to FIG. 4, it is a cross sectional view of a pixel structure 400 according to a third embodiment of the present disclosure. The pixel structure 400 includes multiple microlenses 40, a substrate 45 and a metal wire layer 44 forming a stacked structure from a front side to a backside of the pixel structure 400. The substrate 45 is, for example, a silicon substrate, but not limited to.

The difference between the third embodiment and the above first embodiment is that the pixel structure 400 does not include the first electrode and the second electrode, but includes multiple optically sensitive material (OSM) layers 42 arranged in the substrate 45 and respectively corresponding to one pixel region. The OSM layers 42 are used to receive light and generate signal charges. Each of the OSM layers 42 is attached to (e.g., electrically contact) a node FD.

The metal wire layer 44 also includes an M1 metal layer 441 as the one closest to the OSM layers 42 among multiple metal layers in the metal wire layer 44. The metal wire layer 44 further includes an M2 metal layer 442 and an M3 metal layer 443 stacked along the backside of the pixel structure 400.

The M1 metal layer 441 is closer to the backside of the pixel structure 400 than the substrate 45, and also includes a shielding metal layer 4411, a transfer metal layer 4413 and a reflective metal layer 4412.

The shielding metal layer 4411 is arranged at edges surrounding each pixel region and capable of providing a voltage to the pixel circuit 451. The function and the arrangement of the shielding metal layer 4411 are substantially identical to those of the shielding metal layer 1411 as mentioned above, and thus details thereof are not repeated again.

The transfer metal layer 4413 is attached to (e.g., electrically coupled to) the node FD and used to transfer signal charges generated by the OSM layers 42.

The reflective metal layer 4412 is arranged between the shielding metal layer 4411 and the transfer metal layer 4413 in the transverse direction (e.g., referring to FIGS. 2A to 2G), and is aligned with the multiple OSM layers 42 in the longitudinal direction. The reflective metal layer 4412 is to reflect stray light going through the OSM layers 42 back to the OSM layers 42 to be reused such that the photoelectric conversion efficiency is improved. The function and the arrangement of the reflective metal layer 4412 are substantially identical to those of the reflective metal layer 1412 as mentioned above, and thus details thereof are not repeated again.

It should be mentioned that a size of the second electrode with respect to the first electrode shown in FIGS. 1 and 3 is only intended to illustrate but not to limit the present disclosure.

The pixel structure in the embodiments of the present disclosure is adapted to all pixels of a pixel array of an image sensor. The reflective metal layers in FIGS. 2A to 2G are adaptable to the embodiments of FIGS. 1, 3 and 4. It is appreciated that although the embodiments of FIGS. 1, 3 and 4 show only two adjacent pixel regions, structures of other pixel regions of the pixel array are all identical.

It should be mentioned that although FIGS. 2A to 2G show that the shielding metal layer is completely surrounding (e.g., no disconnecting part) one pixel region in the top view, it is only intended to illustrate but not to limit the present disclosure. In other aspects, the shielding metal layer of at least a part of pixels in a pixel array of the present disclosure is incompletely surrounding (e.g., having disconnecting/broken parts) the associated pixel region in the top view. More specifically, the "surrounding" in the present disclosure is referred to both the "completely surrounding" and "incompletely surrounding".

It should be mentioned that although the above embodiments are described in the way that each microlens is opposite to a single pixel region, it is only intended to illustrate but not to limit the present disclosure. In other aspects, each microlens is opposite to multiple pixel regions without particular limitations.

As mentioned above, in the pixel structure adopting optically sensitive material, stray light can penetrate the gap between bottom electrodes to reach a pixel circuit on a substrate to induce noises in the pixel circuit to result in low light use efficiency. Accordingly, the present disclosure further provides pixel structures (e.g., FIGS. 1, 2 and 3) that arrange an additional reflective metal layer in the metal wire layer. Attributed to surface plasmon resonance effect, the reflective metal layer reflects stray light back to the optically sensitive material layer again to improve light use efficiency. Furthermore, in some aspects, it is able to reduce the amount of light incident into the substrate so as to reduce the noises therein thereby improving the image quality of the image sensor.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A pixel structure, comprising:
a substrate, arranged at a backside of the pixel structure and with a pixel circuit;
a first electrode, arranged at a front side of the pixel structure;
multiple second electrodes, having a gap from one another, and each second electrode being corresponding to one pixel region;
an optically sensitive material (OSM) layer, sandwiched between the first electrode and the multiple second electrodes, wherein the OSM layer is configured to receive light to generate signal charges; and

8 a metal layer, comprising:
a shielding metal layer, surrounding each pixel region and configured to provide a voltage to the pixel circuit;
a transfer metal layer, configured to transfer the signal charges; and
a reflective metal layer, arranged between the shielding metal layer and the transfer metal layer in a transverse direction, and aligned with the gap in a longitudinal direction.

2. The pixel structure as claimed in claim 1, wherein the reflective metal layer comprises multiple metal blocks distributed between the shielding metal layer and the transfer metal layer in the transverse direction.

3. The pixel structure as claimed in claim 2, wherein all of the multiple metal blocks have an identical cross-sectional area.

4. The pixel structure as claimed in claim 2, wherein at least a part of the multiple metal blocks have different cross-sectional areas.

5. The pixel structure as claimed in claim 2, wherein a gap between the multiple metal blocks is smaller than a width of the multiple metal blocks.

6. The pixel structure as claimed in claim 2, wherein at least a part of the multiple metal blocks are connected with the shielding metal layer.

7. The pixel structure as claimed in claim 2, wherein all of the multiple metal blocks are separated from the shielding metal layer.

8. The pixel structure as claimed in claim 2, wherein the multiple metal blocks are symmetrical in two perpendicular directions of the transverse direction.

9. The pixel structure as claimed in claim 2, wherein the multiple metal blocks are rotational symmetry in the transverse direction.

10. The pixel structure as claimed in claim 1, wherein the pixel structure comprises multiple metal layers stacked in the longitudinal direction, and the metal layer is one metal layer closest to the OSM layer among the multiple metal layers.

11. A pixel structure, comprising:
a substrate, arranged with a pixel circuit;
a first electrode, arranged at a front side of the pixel structure;
multiple second electrodes, having a gap from one another, and each second electrode being corresponding to one pixel region;
an optically sensitive material (OSM) layer, sandwiched between the first electrode and the multiple second electrodes, wherein the OSM layer is configured to receive light to generate signal charges; and
a metal layer, arranged to be closer to a backside of the pixel structure than the substrate, and comprising:
a shielding metal layer, surrounding each pixel region and configured to provide a voltage to the pixel circuit;
a transfer metal layer, configured to transfer the signal charges; and
a reflective metal layer, arranged between the shielding metal layer and the transfer metal layer in a transverse direction, and aligned with the gap in a longitudinal direction.

12. The pixel structure as claimed in claim 11, wherein the reflective metal layer comprises multiple metal blocks distributed between the shielding metal layer and the transfer metal layer in the transverse direction.

13. The pixel structure as claimed in claim 12, wherein all of the multiple metal blocks have an identical cross-sectional area, or at least a part of the multiple metal blocks have different cross-sectional areas.

14. The pixel structure as claimed in claim 12, wherein all of the multiple metal blocks are separated from the shielding metal layer, or at least a part of the multiple metal blocks are connected with the shielding metal layer.

15. The pixel structure as claimed in claim 12, wherein a gap between the multiple metal blocks is smaller than a width of the multiple metal blocks.

16. A pixel structure, comprising:

a substrate, arranged at a front side of the pixel structure and with a pixel circuit;

multiple optically sensitive material (OSM) layers, arranged in the substrate, and respectively configured to receive light to generate signal charges; and a metal layer, arranged to be closer to a backside of the pixel structure than the substrate, and comprising:

a shielding metal layer, surrounding each pixel region and configured to provide a voltage to the pixel circuit;

a transfer metal layer, configured to transfer the signal charges; and a reflective metal layer, arranged between the shielding metal layer and the transfer metal layer in a transverse direction, and aligned with the multiple OSM layers in a longitudinal direction.

17. The pixel structure as claimed in claim 16, wherein the reflective metal layer comprises multiple metal blocks distributed between the shielding metal layer and the transfer metal layer in the transverse direction.

18. The pixel structure as claimed in claim 17, wherein all of the multiple metal blocks have an identical cross-sectional area, or at least a part of the multiple metal blocks have different cross-sectional areas.

19. The pixel structure as claimed in claim 17, wherein all of the multiple metal blocks are separated from the shielding metal layer, or at least a part of the multiple metal blocks are connected with the shielding metal layer.

20. The pixel structure as claimed in claim 17, wherein a gap between the multiple metal blocks is smaller than a width of the multiple metal blocks.

\* \* \* \* \*